United States Patent [19]

Griffing

[11] 4,362,598
[45] Dec. 7, 1982

[54] METHOD OF PATTERNING A THICK RESIST LAYER OF POLYMERIC PLASTIC

[75] Inventor: Bruce F. Griffing, Schenectady, N.Y.

[73] Assignee: General Electric Company, Schenectady, N.Y.

[21] Appl. No.: 314,619

[22] Filed: Oct. 26, 1981

[51] Int. Cl.³ .................... B44C 1/22; C03C 15/00; C03C 25/06; C23F 1/02
[52] U.S. Cl. .................... 156/643; 156/646; 156/652; 156/656; 156/659/1; 156/661.1; 156/668; 204/192 E; 427/43.1; 430/313; 430/316; 430/317; 430/318
[58] Field of Search .................... 427/88, 89, 90, 91, 427/43.1; 204/192 E, 192 EC, 164, 298; 156/643, 646, 650, 651, 652, 668, 654-656, 659.1, 661.1; 430/296, 312, 313, 314, 316, 317, 318, 323, 329

[56] References Cited

U.S. PATENT DOCUMENTS 3,873,361 3/1975 Franco et al. .................... 427/88
4,092,210 5/1978 Hoepfner .................... 156/643

Primary Examiner—William A. Powell
Attorney, Agent, or Firm—Julius J. Zaskalicky; James C. Davis, Jr.; Marvin Snyder

[57] ABSTRACT

A method for producing high resolution pattern in a thick layer of polymeric plastic resist is described. The method uses a thin top layer of photo resist in which the desired pattern is formed. The pattern is transferred to a thin metallic inter-layer by wet etching the metallic layer and is subsequently transferred to the thick layer of polymeric plastic by reactive ion etching in oxygen.

1 Claim, 7 Drawing Figures

METHOD OF PATTERNING A THICK RESIST LAYER OF POLYMERIC PLASTIC

The present invention relates to a method of producing a high resolution pattern in a thick layer of a resist of polymeric plastic.

With conventional single level resist, very thin layers of resist are required to replicate the smallest patterns which can be generated optically. These thin layers suffer from several problems which often prevent their direct application to standard processing of substrates to form integrated circuits. These problems include the loss of resolution over vertical steps, minimal resistance to breakdown during etching procedures, a lack of stopping power for ion implantation masking and standing wave effects.

All four of these difficulties can be overcome by a two layer resist process. A first thick layer provides a smooth surface for a second thin patterning layer. The desired pattern is first replicated in the thin upper layer. This pattern is then transferred to the thick underlayer by a separate processing step. An example of such a process is described by B. J. Lin, AZ1350J as a "Deep UV Mask Material", J. Electrochemical Soc. 127, p. 202 (1980). This process requires a blanket exposure to deep ultraviolet radiation of a thick underlayer of polymethyl methacrylate and also requires several wet processing steps.

The present invention is directed to a method which does not require ultraviolet exposure and also which reduces the number of wet processing steps required in two level resist processes.

A principal object of the present invention is to provide a combination of steps for producing high resolution patterns in thick layers of polymeric plastic using conventional materials and conventional processing steps.

In carrying out the method of the present invention in accordance with one embodiment thereof a substrate including a surface and constituted of a first material is provided. A first thick resist layer of a polymeric plastic is formed on the surface of the substrate. A second thin layer of titanium is formed on the first thick layer of resist. A third thin layer of a resist having a removed portion and a pair of retained portions is formed on the second layer of titanium with adjacent edges of the pair of retained portions spaced apart by a predetermined distance. The second layer of titanium is etched through the removed portions of the third layer of resist to form an opening in the second layer exposing the surface of the first thick layer of resist. The walls of the opening underlie the third layer of resist and are spaced from the adjacent edges of the retained portions of the third layer of resist. The adjacent edges of the exposed portion of the surface of the first thick layer of resist are spaced apart by substantially the aforementioned predetermined distance. The first layer of polymeric plastic is reactive ion etched in oxygen through the opening in the second layer to form an opening in the first layer extending to the substrate with the opposed walls of the opening in the first layer being spaced apart by substantially the aforementioned predetermined distance.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
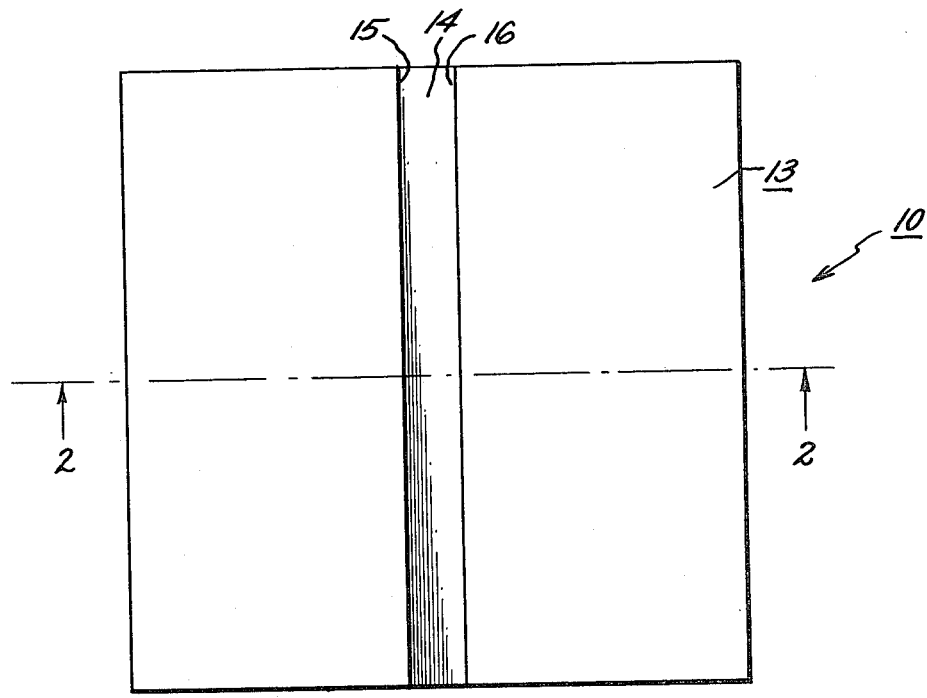
FIG. 1 is plan view of a composite body representing a section of an integrated circuit showing a silicon substrate on which is formed a thick resist layer of a polymeric plastic having an opening of small dimensions formed therein.
Figure 2:
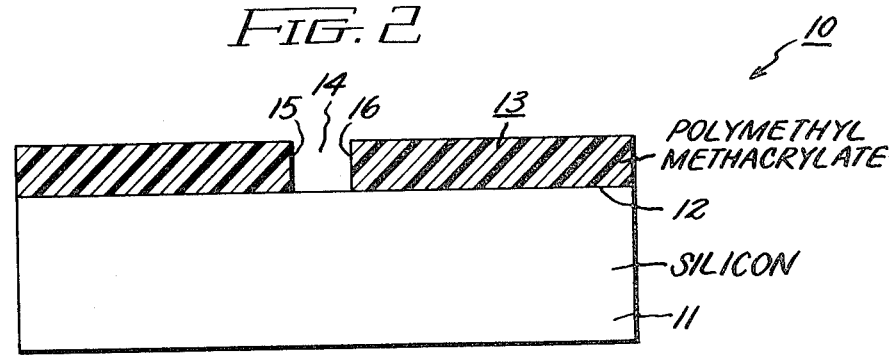
FIG. 2 is a cross-sectional view of the section of the substrate of FIG. 1 taken along section lines 2—2 thereof.

Referring now to FIGS. 1 and 2, there is shown a composite body 10 representing a step in the process of making an integrated circuit made in accordance with the present invention. The composite body 10 includes a substrate 11 of a suitable material, such as silicon, which may have included thereon other layers such as layers of insulating materials and conductive materials (not shown). It is desired to modify the substrate 11 whether it be a layer of silicon, a layer of conductive material or a layer of an insulating material, such as silicon dioxide. A thick layer 13 of a polymeric plastic material such as polymethyl methacrylate (PMMA) is provided on the surface 12 of the substrate 11 with a removed portion or opening 14 through which modification of the substrate may be made through processes such as plasma etching, ion milling, ion beam etching, reactive ion beam etching etc. Accordingly, shown on the major surface 12 of the substrate 11 is a thick layer 13 of polymethyl methacrylate having an opening 14 therein with a pair of side walls 15 and 16 which are closely spaced.

Figure 3A:
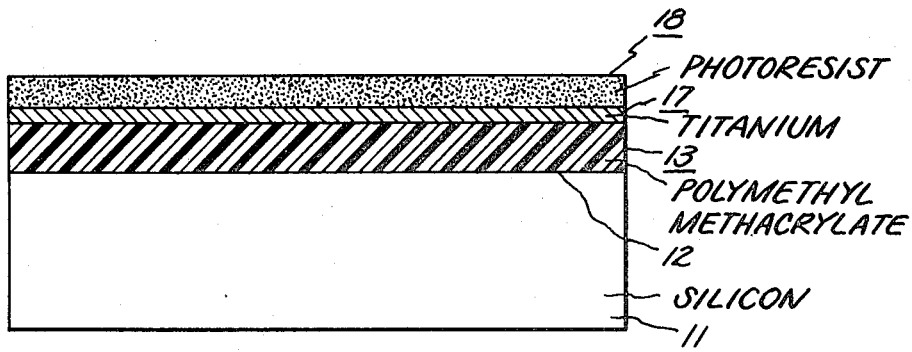
FIGS. 3A–3E show cross sections of structures representing successive steps in one method of fabricating the composite structure of FIGS. 1 and 2 in accordance with the present invention.
Figure 3B:
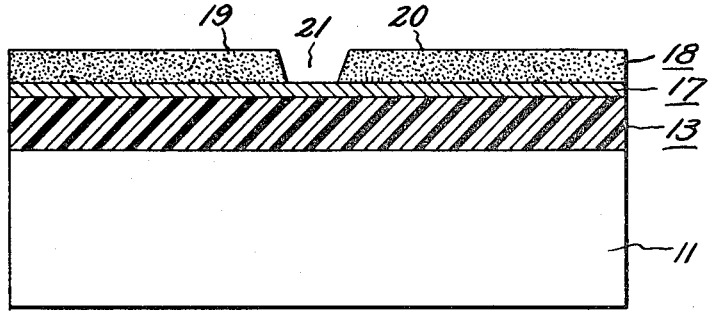
Figure 3C:
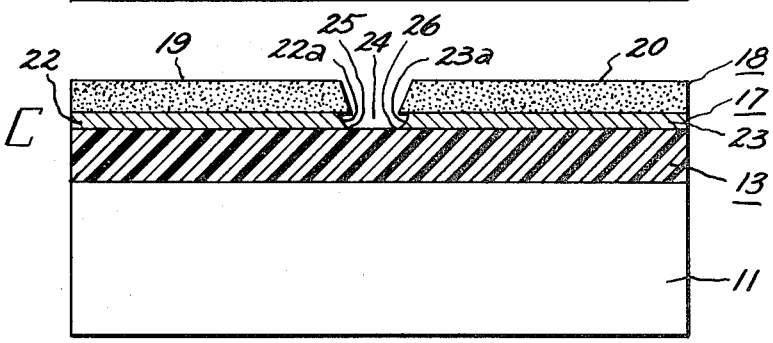

A method of fabricating the composite structure of FIGS. 1 and 2 in accordance with the present invention will now be described in connection with FIGS. 3A through 3E. Elements of FIGS. 3A-3E identical to elements of FIGS. 1 and 2 are identically designated. A substrate 11 of silicon semiconductor material of 10 ohm centimeter resistivity and n-type conductivity having a major surface 12 parallel to a (100) crystallographic plane thereof is provided. A first layer 13 of polymethyl methacrylate about 2 microns thick is formed on the major surface 12 by techniques well known in the art, for example by depositing a solution of polymethyl methacrylate on the surface 12 of the substrate, spinning the substrate and thereafter baking the substrate to form a layer of the desired thickness. A second layer 17 of titanium, which is impervious to erosion when subject to reactive ion etching in oxygen, about 1000 Angstroms thick is then deposited over the first layer 13 of polymethyl methacrylate. A thin layer 18 of a suitable photoresist 18, such as an azide resist AZ1470 available from the Shipley Co. of Newton, Mass., is applied over the second layer 17 of titanium. The layer of photoresist conveniently may have a thickness of 0.3 micron. The photoresist is exposed to a light pattern and developed to provide retained portions 19 and 20 and a removed portion 21 exposing a portion of the surface of the layer of titanium 17 unprotected by the photoresist. The portion of the layer 17 of titanium unprotected by the layer of photoresist is etched through the removed portion 21 of the layer of photoresist 18 using an etch to which the photoresist layer 18 is resistant, for example fluoroboric acid or dry etch with carbon tetrachloride, to form an opening or removed portion 24 and retained portions 22 and 23 in the layer of titanium, as shown in FIG. 3C. Titanium is quite reactive and etches quite easily in most acids. Its reactivity does, however, lead to surface layers of oxide which etch much more slowly or not at all in acids. In order to achieve uniform etching of the titanium layer, it is first necessary to remove the oxide layer. This is accomplished by a short plasma etch of the exposed surface of the titanium layer in carbon tetrachloride. This plasma etch is immediately followed by a wet etch in a mixture of fluoroboric acid and water in a ratio of 1 part of fluoroboric acid to 10 parts of water by volume. Titanium etches slowly enough in this mixture so that the process can be easily controlled. The etching is done for a period of time that allows the titanium to be etched laterally as well as vertically leaving the profile shown in FIG. 3C. The etching process is carried out for a sufficient period of time to cause the adjacent walls 22a and 23a, of retained portions 22 and 23 of the titanium layer to underlie the respective retained portions 19 and 20 of the resist. The portion of the surface of the layer 13 of polymethyl methacrylate exposed by the removed portion 24 of the layer of titanium has a pair of edges 25 and 26 spaced apart by a small predetermined distance substantially equal to the distance between adjacent under edges of the retain portions 19 and 20 of the photoresist. The spacing between edges 25 and 26 is set by the amount of undercutting of the layer 17 of titanium in the process of etching this layer to form the retained portions 22 and 23 thereof. This distance may be quite small, for example a fraction of a micron.

Figure 3D:
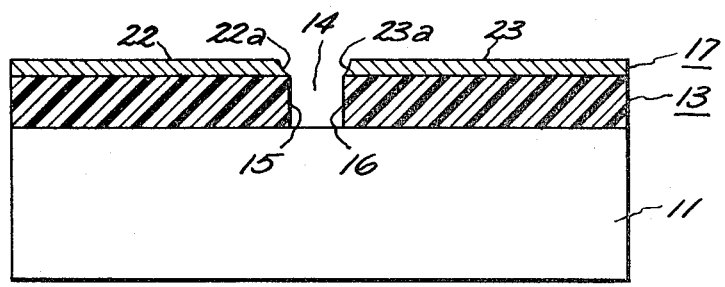
Figure 3E:
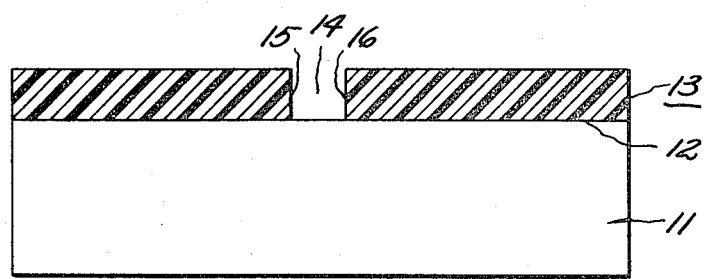

In the next step of the process, the exposed surface of the layer of polymethyl methacrylate and the exposed surfaces of the retained portions 22 and 23 of the titanium layer are reactive ion etched in oxygen to provide an opening 14 extending through the exposed portion of a layer 13 of polymethyl methacrylate to the substrate as shown in FIG. 3D. Reactive ion etching in oxygen serves to remove the thin layer 18 of resist. The retained portions 22 and 23 of the layer of titanium can be removed at this point in the process, if desired, using buffered hydrofluoric acid to produce a structure such as shown in FIG. 3E. The retained portions 22 and 23 can also be lifted off by removal of the patterned layer of polymethyl methacrylate after the patterned layer of polymethyl methacrylate has served its function. At this point in the process, the patterned mask of polymethyl methacrylate is utilized to perform other operations on the substrate. Often the next processing step required on the substrate is a reactive ion etching step to etch a pattern in the substrate of silicon or other material such as a layer of metallization or a layer of insulation. Conveniently, the substrate at this point does not have to be removed from the reactive ion etching system for performing the operation.

A particular advantage of the method described above using titanium as the patterning layer for the first layer of polymeric plastic is that the layer of titanium can be made quite thin with resultant higher resolution than with masking layers of other materials such as silicon dioxide. The erosion resistant component of a layer of titanium is titanium dioxide which is formed thereon in situ by reactive ion etching in oxygen. The use of the metal titanium instead of a much thicker layer of titanium dioxide effectively reduces the amount of material which must be initially deposited to supply the requisite erosion resistant material. Furthermore titanium dioxide is superior in erosion resistance to most other materials, such as silicon dioxide in most processes. Another advantage of the method described above is that the number of wet etch steps utilized in patterning the layer of polymethyl methacrylate is reduced.

While in the process described above the first thick layer of a polymeric plastic is constituted of polymethyl methacrylate, other polymeric plastic materials such as novolak resins could be used.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. A method of forming in a first thick layer of a polymeric plastic overlying a surface of a substrate, an opening having a pair of opposed sides spaced apart by a predetermined distance comprising:

providing said first thick layer of polymeric plastic on said surface of said substrate, forming a second thin layer of titanium on said first layer, forming a third thin layer of a resist having a pair of retained portions and a removed portion on said second layer, the adjacent edges of said pair of retained portions spaced apart by said predetermined distance, etching said second layer through said removed portion of said third layer to form an opening in said second layer exposing the surface of said first thick layer of polymeric plastic, the walls of said opening underlying said third layer and spaced from said adjacent edges of said retained portions of said third layer, adjacent edges of the exposed portion of said surface of said first thick layer being spaced apart by substantially said predetermined distance, said second layer of titanium being plasma etched in carbon tetrachloride and immediately thereafter etched in a mixture of fluoroboric acid and water in a ratio of 1 part of fluoroboric acid to 10 parts of water by volume, reactive ion etching in oxygen said first layer of polymeric plastic through said opening in said second layer to form an opening in said first layer extending to said substrate, opposed walls of said opening in said first layer being spaced apart by substantially said predetermined distance.

* * * * *